(12) United States Patent
Vasilache

(10) Patent No.: US 12,347,442 B2
(45) Date of Patent: Jul. 1, 2025

(54) SPATIAL AUDIO PARAMETER ENCODING AND ASSOCIATED DECODING

(71) Applicant: Nokia Technologies Oy, Espoo (FI)

(72) Inventor: Adriana Vasilache, Tampere (FI)

(73) Assignee: NOKIA TECHNOLOGIES OY, Espoo (FI)

(*) Notice: Subject to any disclaimer, the term of this patent is extended or adjusted under 35 U.S.C. 154(b) by 210 days.

(21) Appl. No.: 17/791,115

(22) PCT Filed: Dec. 7, 2020

(86) PCT No.: PCT/FI2020/050821
§ 371 (c)(1),
(2) Date: Jul. 6, 2022

(87) PCT Pub. No.: WO2021/144498
PCT Pub. Date: Jul. 22, 2021

(65) Prior Publication Data
US 2023/0047237 A1    Feb. 16, 2023

(30) Foreign Application Priority Data
Jan. 13, 2020 (GB) .................................. 2000465

(51) Int. Cl.
*G10L 19/008*  (2013.01)
*G10L 19/002*  (2013.01)

(52) U.S. Cl.
CPC .......... *G10L 19/008* (2013.01); *G10L 19/002* (2013.01)

(58) Field of Classification Search
CPC . G10L 19/008; G10L 19/002; G10L 19/0017; G10L 19/0204; G10L 19/032;
(Continued)

(56) References Cited

U.S. PATENT DOCUMENTS

| 2015/0146873 A1 | 5/2015 | Chabanne et al. |
| 2019/0348052 A1 | 11/2019 | Friedrich et al. |
| 2020/0273473 A1 | 8/2020 | Fuchs et al. |

FOREIGN PATENT DOCUMENTS

| GB | 2575305 A | 1/2020 |
| GB | 2577698 A | 4/2020 |

(Continued)

OTHER PUBLICATIONS

Search Report received for corresponding United Kingdom Patent Application No. 2000465.1, dated Jun. 12, 2020, 3 pages.
(Continued)

*Primary Examiner* — Daniel C Washburn
*Assistant Examiner* — Penny L Caudle
(74) *Attorney, Agent, or Firm* — ALSTON & BIRD LLP

(57) ABSTRACT

An apparatus comprising means configured to obtain direction parameter values (108) associated with at least two time-frequency parts (202) of at least one audio signal (102); and encode the obtained direction parameter values based on a codebook (206), wherein the codebook comprises two or more quantization levels arranged such that a first quantization level comprises a first set of quantization values, and a second or succeeding quantization level comprises a second or further set of quantization values and preceding quantization level quantization values.

6 Claims, 10 Drawing Sheets

(58) Field of Classification Search
CPC .. H04S 3/008; H04S 2420/03; H04S 2420/11; H03M 7/4031

See application file for complete search history.

(56) References Cited

FOREIGN PATENT DOCUMENTS

| | | | |
|---|---|---|---|
| GB | 2578625 | A | 5/2020 |
| GB | 2582910 | A | 10/2020 |
| GB | 2587196 | A | 3/2021 |
| JP | 2021503628 | A | 2/2021 |
| WO | WO 2014/128275 | A1 | 8/2014 |
| WO | 2019/097018 | A1 | 5/2019 |
| WO | WO 2019/097017 | A1 | 5/2019 |
| WO | WO 2019/170955 | A1 | 9/2019 |
| WO | WO-2019193173 | A1 * | 10/2019 ......... G10L 19/0017 |
| WO | WO 2020/008105 | A1 | 1/2020 |
| WO | WO-2020007719 | A1 * | 1/2020 ............. G06F 3/162 |
| WO | 2020/089510 | A1 | 5/2020 |
| WO | 2021/136879 | A1 | 7/2021 |

OTHER PUBLICATIONS

International Search Report and Written Opinion received for corresponding Patent Cooperation Treaty Application No. PCT/FI2020/050821, dated Apr. 8, 2021, 17 pages.

Cheng et al., "A General Compression Approach to Multi-Channel Three-Dimensional Audio", IEEE Transactions on Audio, Speech, and Language Processing, vol. 21, No. 8, Aug. 2013, pp. 1676-1688.

"Description of the IVAS MASA C Reference Software", 3GPP TSG-SA4#106 meeting, S4-191167, Agenda: 7.5, Nokia Corporation, Oct. 21-25, 2019, pp. 1-16.

Office action received for corresponding Indian Patent Application No. 202247046241, dated Nov. 11, 2022, 5 pages.

Li et al., "The Perceptual Lossless Quantization of Spatial Parameter for 3D Audio Signals", International Conference on Multimedia Modeling, 2017, pp. 381-392.

Office action received for corresponding Japanese Patent Application No. 2022-542955, dated Oct. 19, 2023, 5 pages of office action and 7 pages of translation available.

Extended European Search Report received for corresponding European Patent Application No. 20914567.1, dated Jan. 17, 2024, 8 pages.

Office action received for corresponding Japanese Patent Application No. 2022-542955, dated Jun. 24, 2024, 2 pages of office action and 9 Pages of summary and translation available.

Decision to Grant for Japanese Application No. 2022-542955 dated Dec. 12, 2024, 4 pages.

Office Action for Chinese Application No. 202080092858.9 dated Jan. 22, 2025, 27 pages.

Office Action for Korean Application No. 10-2022-7027889 dated Mar. 20, 2025, 13 pages.

* cited by examiner

SPATIAL AUDIO PARAMETER ENCODING AND ASSOCIATED DECODING

RELATED APPLICATION

This application was originally filed as PCT Application No. PCT/FI2020/050821, filed on Dec. 7, 2020, which claims priority from GB Application No. 2000465.1, filed on Jan. 13, 2020, each of which is incorporated herein by reference in its entirety.

FIELD

The present application relates to apparatus and methods for sound-field related parameter encoding, but not exclusively for time-frequency domain direction related parameter encoding for an audio encoder and decoder.

BACKGROUND

Parametric spatial audio processing is a field of audio signal processing where the spatial aspect of the sound is described using a set of parameters. For example, in parametric spatial audio capture from microphone arrays, it is a typical and an effective choice to estimate from the microphone array signals a set of directional metadata parameters such as directions of the sound in frequency bands, and the ratios between the directional and non-directional parts of the captured sound in frequency bands. These parameters are known to well describe the perceptual spatial properties of the captured sound at the position of the microphone array. These parameters can be utilized in synthesis of the spatial sound accordingly, for headphones binaurally, for loudspeakers, or to other formats, such as Ambisonics.

The directional metadata such as directions and direct-to-total energy ratios in frequency bands are thus a parameterization that is particularly effective for spatial audio capture.

A directional metadata parameter set consisting of one or more direction value for each frequency band and an energy ratio parameter associated with each direction value can be also utilized as spatial metadata (which may also include other parameters such as spread coherence, number of directions, distance, etc.) for an audio codec. The directional metadata parameter set may also comprise other parameters or may be associated with other parameters which are considered to be non-directional (such as surround coherence, diffuse-to-total energy ratio, remainder-to-total energy ratio). For example, these parameters can be estimated from microphone-array captured audio signals, and for example a stereo signal can be generated from the microphone array signals to be conveyed with the spatial metadata.

As some codecs are expected to operate at various bit rates ranging from very low bit rates to relatively high bit rates, various strategies are needed for the compression of the spatial metadata to optimize the codec performance for each operating point. The raw bitrate of the encoded parameters (metadata) is relatively high, so especially at lower bitrates it is expected that only the most important parts of the metadata can be conveyed from the encoder to the decoder.

A decoder can decode the audio signals into PCM signals and process the sound in frequency bands (using the spatial metadata) to obtain the spatial output, for example a binaural output.

The aforementioned solution is particularly suitable for encoding captured spatial sound from microphone arrays (e.g., in mobile phones, video cameras, VR cameras, stand-alone microphone arrays). However, it may be desirable for such an encoder to have also other input types than microphone-array captured signals, for example, loudspeaker signals, audio object signals, or Ambisonics signals.

SUMMARY

There is provided according to a first aspect an apparatus comprising means configured to: obtain direction parameter values associated with at least two time-frequency parts of at least one audio signal; and encode the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

The means configured to encode the obtained direction parameter values based on a codebook may be further configured to: determine, relative to each of the obtained direction parameter values, a closest quantization value from the set of quantization values of a determined quantization level and preceding quantization level quantization values; and generate a codeword for each of the obtained direction parameter values based on the associated closest quantization value.

The means configured to encode the obtained direction parameter values based on a codebook may be further configured to entropy encode the generated codewords for a sub-band within a frame comprising sub-bands and time blocks.

The means configured to encode the obtained direction parameter values based on a codebook may be further configured to iteratively: compare a number of bits required to entropy encode codewords for direction parameter values for a sub-band within a frame comprising sub-bands and time blocks based on a selected quantization level to an allocated number of bits; select a preceding quantization level, and re-encode the obtained direction parameter values based on the preceding quantization level dependent on the number of bits required to entropy encode codewords for direction parameter values being greater than the allocated number of bits, until the number of bits required to entropy encode codewords for direction parameter values is equal to or less than the allocated number of bits.

The means configured to encode the direction parameter values based on a codebook may be further configured to: order determined closest quantization values for direction parameter values for a sub-band within a frame comprising sub-bands and time blocks based on a determined angular quantization distortion; iteratively and in the determined order, select one of the closest quantization values and: determine whether the selected closest quantization value is a member of the preceding quantization level quantization values; and re-encode the obtained direction parameter values using the preceding quantization level quantization values, until the number of bits required to entropy encode codewords for direction parameter values is equal to or less than the allocated number of bits.

The means configured to encode the obtained direction parameter values based on a codebook may be further configured to: encode azimuth direction parameter values based on the codebook; and encode elevation direction parameter values based on at least one average elevation direction parameter value for a sub-band within a frame comprising sub-bands and time blocks.

The means may be further configured to determine the allocated number of bits for encoding each sub-band within a frame comprising sub-bands and time blocks based on a value of an energy ratio value associated with the obtained direction parameter values.

According to a second aspect there is provided an apparatus comprising means configured to: obtain at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decode the at least one codebook encoded direction parameter value.

According to a third aspect there is provided a method comprising: obtaining direction parameter values associated with at least two time-frequency parts of at least one audio signal; and encoding the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

Encoding the obtained direction parameter values based on a codebook may comprise: determining, relative to each of the obtained direction parameter values, a closest quantization value from the set of quantization values of a determined quantization level and preceding quantization level quantization values; and generating a codeword for each of the obtained direction parameter values based on the associated closest quantization value.

Encoding the obtained direction parameter values based on a codebook may further comprise entropy encoding the generated codewords for a sub-band within a frame comprising sub-bands and time blocks.

Encoding the obtained direction parameter values based on a codebook may further comprise iteratively: comparing a number of bits required to entropy encode codewords for direction parameter values for a sub-band within a frame comprising sub-bands and time blocks based on a selected quantization level to an allocated number of bits; selecting a preceding quantization level, and re-encode the obtained direction parameter values based on the preceding quantization level dependent on the number of bits required to entropy encode codewords for direction parameter values being greater than the allocated number of bits, until the number of bits required to entropy encode codewords for direction parameter values is equal to or less than the allocated number of bits.

Encoding the direction parameter values based on a codebook may further comprise: ordering the determined closest quantization values for direction parameter values for a sub-band within a frame comprising sub-bands and time blocks based on a determined angular quantization distortion; and iteratively and in the determined order selecting one of the closest quantization values, determining whether the selected closest quantization value is a member of the preceding quantization level quantization values, and re-encoding the obtained direction parameter values using the preceding quantization level quantization values, until the number of bits required to entropy encode codewords for direction parameter values is equal to or less than the allocated number of bits.

Encoding the obtained direction parameter values based on a codebook may further comprise: encoding azimuth direction parameter values based on the codebook; and encoding elevation direction parameter values based on at least one average elevation direction parameter value for a sub-band within a frame comprising sub-bands and time blocks.

The method may further comprise determining the allocated number of bits for encoding each sub-band within a frame comprising sub-bands and time blocks based on a value of an energy ratio value associated with the obtained direction parameter values.

According to a fourth aspect there is provided a method comprising: obtaining at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decoding the at least one codebook encoded direction parameter value.

According to a fifth aspect there is provided an apparatus comprising at least one processor and at least one memory including a computer program code, the at least one memory and the computer program code configured to, with the at least one processor, cause the apparatus at least to: obtain direction parameter values associated with at least two time-frequency parts of at least one audio signal; and encode the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

The apparatus caused to encode the obtained direction parameter values based on a codebook may be further caused to: determine, relative to each of the obtained direction parameter values, a closest quantization value from the set of quantization values of a determined quantization level and preceding quantization level quantization values; and generate a codeword for each of the obtained direction parameter values based on the associated closest quantization value.

The apparatus caused to encode the obtained direction parameter values based on a codebook may be further caused to entropy encode the generated codewords for a sub-band within a frame comprising sub-bands and time blocks.

The apparatus caused to encode the obtained direction parameter values based on a codebook may be further caused to iteratively: compare a number of bits required to entropy encode codewords for direction parameter values for a sub-band within a frame comprising sub-bands and time blocks based on a selected quantization level to an allocated number of bits; select a preceding quantization level, and re-encode the obtained direction parameter values based on the preceding quantization level dependent on the number of bits required to entropy encode codewords for direction parameter values being greater than the allocated number of bits, until the number of bits required to entropy encode codewords for direction parameter values is equal to or less than the allocated number of bits.

The apparatus caused to encode the direction parameter values based on a codebook may be further caused to: order determined closest quantization values for direction parameter values for a sub-band within a frame comprising sub-bands and time blocks based on a determined angular quantization distortion; iteratively and in the determined order, select one of the closest quantization values and: determine whether the selected closest quantization value is a member of the preceding quantization level quantization values; and re-encode the obtained direction parameter values using the preceding quantization level quantization values, until the number of bits required to entropy encode codewords for direction parameter values is equal to or less than the allocated number of bits.

The apparatus caused to encode the obtained direction parameter values based on a codebook may be further caused to: encode azimuth direction parameter values based on the codebook; and encode elevation direction parameter values based on at least one average elevation direction parameter value for a sub-band within a frame comprising sub-bands and time blocks.

The apparatus may be further caused to determine the allocated number of bits for encoding each sub-band within a frame comprising sub-bands and time blocks based on a value of an energy ratio value associated with the obtained direction parameter values.

According to a sixth aspect there is provided an apparatus comprising at least one processor and at least one memory including a computer program code, the at least one memory and the computer program code configured to, with the at least one processor, cause the apparatus at least to: obtain at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decode the at least one codebook encoded direction parameter value.

According to a seventh aspect there is provided an apparatus comprising: means for obtaining direction parameter values associated with at least two time-frequency parts of at least one audio signal; and means for encoding the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

According to an eighth aspect there is provided an apparatus comprising: means for obtaining at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and means for decoding the at least one codebook encoded direction parameter value.

According to a ninth aspect there is provided a computer program comprising instructions [or a computer readable medium comprising program instructions] for causing an apparatus to perform at least the following: obtaining direction parameter values associated with at least two time-frequency parts of at least one audio signal; and encoding the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

According to a tenth aspect there is provided a computer program comprising instructions [or a computer readable medium comprising program instructions] for causing an apparatus to perform at least the following: obtaining at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decoding the at least one codebook encoded direction parameter value.

According to an eleventh aspect there is provided a non-transitory computer readable medium comprising program instructions for causing an apparatus to perform at least the following: obtaining direction parameter values associated with at least two time-frequency parts of at least one audio signal; and encoding the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

According to a twelfth aspect there is provided a non-transitory computer readable medium comprising program instructions for causing an apparatus to perform at least the following: obtaining at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decoding the at least one codebook encoded direction parameter value.

According to a thirteenth aspect there is provided an apparatus comprising: obtaining circuitry configured to obtain direction parameter values associated with at least two time-frequency parts of at least one audio signal; and encoding circuitry configured to encode the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

According to a fourteenth aspect there is provided an apparatus comprising: obtaining circuitry configured to obtain at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decoding circuitry configured to decode the at least one codebook encoded direction parameter value.

According to a fifteenth aspect there is provided a computer readable medium comprising program instructions for causing an apparatus to perform at least the following: obtaining direction parameter values associated with at least two time-frequency parts of at least one audio signal; and encoding the obtained direction parameter values based on a codebook, wherein the codebook comprises two or more quantization levels arranged such that a first quantization level comprises a first set of quantization values, and a second or succeeding quantization level comprises a second or further set of quantization values and preceding quantization level quantization values.

According to a sixteenth aspect there is provided a computer readable medium comprising program instructions for causing an apparatus to perform at least the following: obtaining at least one encoded bitstream comprising at least one codebook encoded direction parameter value, wherein the codebook comprises two or more quantization levels arranged such that a first quantization level comprises a first set of quantization values, and a second or succeeding quantization level comprises a second or further set of quantization values and preceding quantization level quantization values; and decoding the at least one codebook encoded direction parameter value.

An apparatus comprising means for performing the actions of the method as described above.

An apparatus configured to perform the actions of the method as described above.

A computer program comprising program instructions for causing a computer to perform the method as described above.

A computer program product stored on a medium may cause an apparatus to perform the method as described herein.

An electronic device may comprise apparatus as described herein.

A chipset may comprise apparatus as described herein.

Embodiments of the present application aim to address problems associated with the state of the art.

SUMMARY OF THE FIGURES

For a better understanding of the present application, reference will now be made by way of example to the accompanying drawings in which.

EMBODIMENTS OF THE APPLICATION

Figure 1:
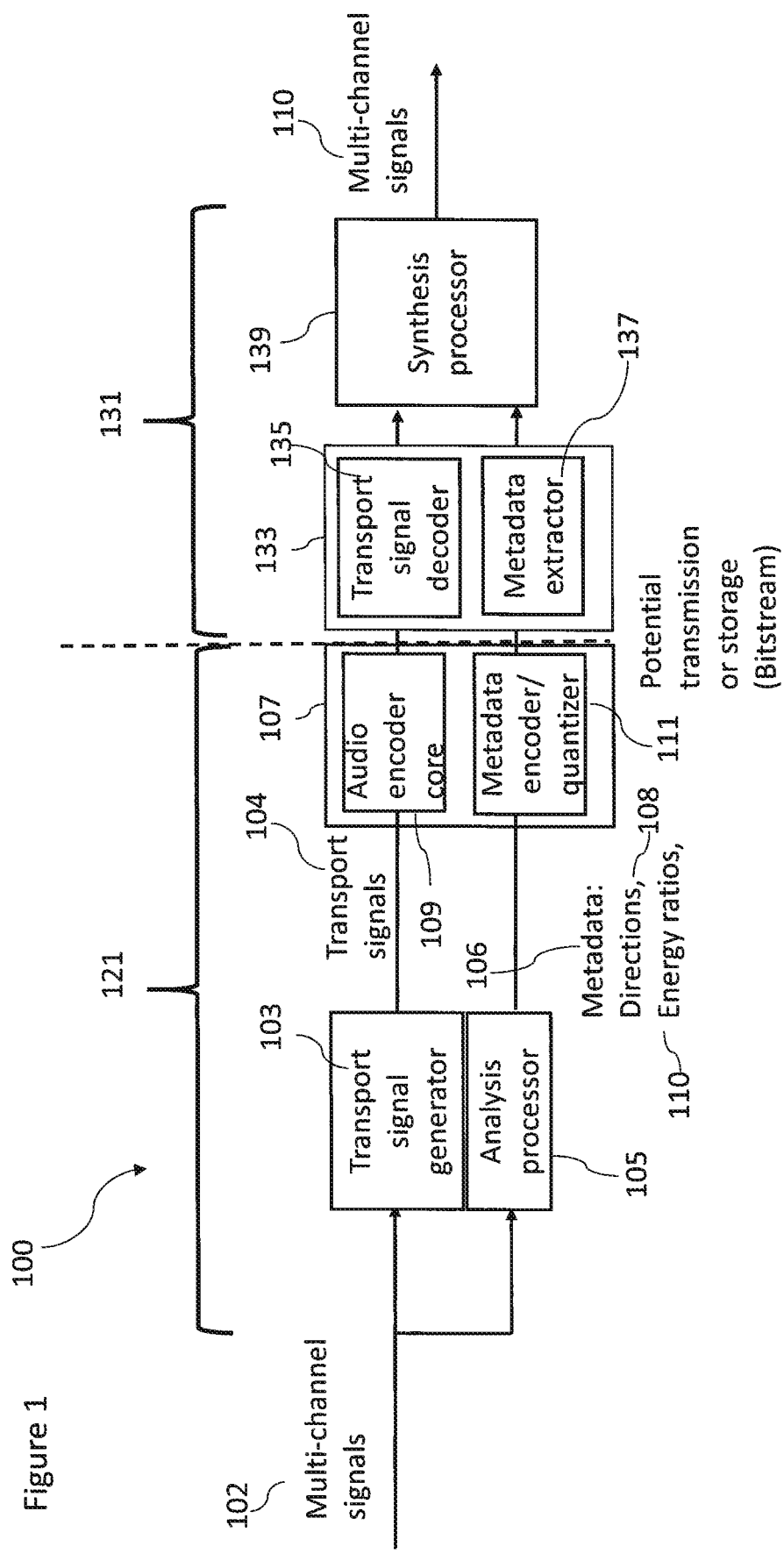
FIG. 1 shows schematically a system of apparatus suitable for implementing some embodiments.

The following describes in further detail suitable apparatus and possible mechanisms for the provision of combining and encoding spatial analysis derived metadata parameters. In the following discussions a multi-channel system is discussed with respect to a multi-channel microphone implementation. However as discussed above the input format may be any suitable input format, such as multi-channel loudspeaker, Ambisonics (FOA/HOA) etc. It is understood that in some embodiments the channel location is based on a location of the microphone or is a virtual location or direction.

Furthermore in the following examples the output of the example system is a multi-channel loudspeaker arrangement. In other embodiments the output may be rendered to the user via means other than loudspeakers. The multi-channel loudspeaker signals may be also generalised to be two or more playback audio signals.

As discussed above directional metadata associated with the audio signals may comprise multiple parameters (such as multiple directions, and associated with each direction a direct-to-total ratio, distance, etc.) per time-frequency tile. The directional metadata may also comprise other parameters or may be associated with other parameters which are considered to be non-directional (such as surround coherence, diffuse-to-total energy ratio, remainder-to-total energy ratio) but when combined with the directional parameters are able to be used to define the characteristics of the audio scene. For example a reasonable design choice which is able to produce a good quality output is one where the directional metadata comprises two directions for each time-frequency subframe (and associated with each direction direct-to-total ratios, distance values etc) are determined. However as also discussed above, bandwidth and/or storage limitations may require a codec not to send directional metadata parameter values for each frequency band and temporal sub-frame.

The current proposals include those disclosed in GB patent application 1811071.8 which has considered the lossy compression of metadata and for PCT/FI2019/050675 when very low number of bits are available for a given subband, a vector quantization approach has been discussed. Even though only up to 9 bits codebook, the vector quantizer approach increases the table ROM of the codec with approximately 4 kB of memory used for 4 dimensional codebooks of 2, 3, 4, . . . , and 9 bits.

The concept as discussed within the embodiments hereafter relates to encoding of spatial audio streams with transport audio signals and (spatial) directional metadata where apparatus and methods are described that implement an embedded codebook with flexible borders rather than use the vector quantizer. In order to reduce memory consumption, in some embodiments the codebook is one dimensional and the codewords are indexed such that those forming the 1bit codebook come first, followed by those belonging to the 2bit codebook, but not to the 1 bit codebook, then those belonging to the 3bit codebook, but not to those of 1 and 2 bits and so on. In such embodiments one subband is encoded at a time. Based on the available number of bits for the current subband and the distance to the non-quantized audio directional data the codewords for each time-frequency tile are selected and their indexes are encoded using a suitable entropy coding method, for example Golomb Rice coding.

With respect to FIG. 1 an example apparatus and system for implementing embodiments of the application are shown. The system 100 is shown with an 'analysis' part 121 and a 'synthesis' part 131. The 'analysis' part 121 is the part from receiving the multi-channel signals up to an encoding of the directional metadata and transport signal and the 'synthesis' part 131 is the part from a decoding of the encoded directional metadata and transport signal to the presentation of the re-generated signal (for example in multi-channel loudspeaker form).

In the following description the 'analysis' part 121 is described as a series of parts however in some embodiments the part may be implemented as functions within the same functional apparatus or part. In other words in some embodiments the 'analysis' part 121 is an encoder comprising at least one of the transport signal generator or analysis processor as described hereafter.

The input to the system 100 and the 'analysis' part 121 is the multi-channel signals 102. The 'analysis' part 121 may comprise a transport signal generator 103, analysis processor 105, and encoder 107. In the following examples a microphone channel signal input is described, however any suitable input (or synthetic multi-channel) format may be implemented in other embodiments. In such embodiments the directional metadata associated with the audio signals may be a provided to an encoder as a separate bit-stream. The multi-channel signals are passed to a transport signal generator 103 and to an analysis processor 105.

In some embodiments the transport signal generator 103 is configured to receive the multi-channel signals and generate a suitable audio signal format for encoding. The transport signal generator 103 can for example generate a stereo or mono audio signal. The transport audio signals generated by the transport signal generator can be any known format. For example when the input is one where the audio signals input are mobile phone microphone array audio signals, the transport signal generator 103 can be configured to select a left-right microphone pair, and apply any suitable processing to the audio signal pair, such as automatic gain control, microphone noise removal, wind noise removal, and equalization. In some embodiments when the input is a first order Ambisonic/higher order Ambisonic (FOA/HOA) signal, the transport signal generator can be configured to formulate directional beam signals towards left and right directions, such as two opposing cardioid signals. Additionally in some embodiments when the input is a loudspeaker surround mix and/or objects, then the transport signal generator 103 can be configured to generate a downmix signal that combines left side channels to a left downmix channel, combined right side channels to a right downmix channel and adds centre channels to both transport channels with a suitable gain.

In some embodiments the transport signal generator is bypassed (or in other words is optional). For example, in some situations where the analysis and synthesis occur at the same device at a single processing step, without intermediate processing there is no transport signal generation and the input audio signals are passed unprocessed. The number of transport channels generated can be any suitable number and not for example one or two channels.

The output of the transport signal generator 103 can be passed to an encoder 107.

In some embodiments the analysis processor 105 is also configured to receive the multi-channel signals and analyse the signals to produce directional metadata 106 associated with the multi-channel signals and thus associated with the transport signals 104.

The analysis processor 105 may be configured to generate the directional metadata parameters which may comprise, for each time-frequency analysis interval, at least one direction parameter 108 and at least one energy ratio parameter 110 (and in some embodiments other parameters, of which a non-exhaustive list includes number of directions, surround coherence, diffuse-to-total energy ratio, remainder-to-total energy ratio, a spread coherence parameter, and distance parameter). The direction parameter may be represented in any suitable manner, for example as spherical co-ordinates denoted as azimuth $\varphi(k,n)$ and elevation $\theta(k,n)$.

In some embodiments the number of the directional metadata parameters may differ from time-frequency tile to time-frequency tile. Thus for example in band X all of the directional metadata parameters are obtained (generated) and transmitted, whereas in band Y only one of the directional metadata parameters is obtained and transmitted, and furthermore in band Z no parameters are obtained or transmitted. A practical example of this may be that for some time-frequency tiles corresponding to the highest frequency band some of the directional metadata parameters are not required for perceptual reasons. The directional metadata 106 may be passed to an encoder 107.

In some embodiments the analysis processor 105 is configured to apply a time-frequency transform for the input signals. Then, for example, in time-frequency tiles when the input is a mobile phone microphone array, the analysis processor could be configured to estimate delay-values between microphone pairs that maximize the inter-microphone correlation. Then based on these delay values the analysis processor may be configured to formulate a corresponding direction value for the directional metadata. Furthermore the analysis processor may be configured to formulate a direct-to-total ratio parameter based on the correlation value.

In some embodiments, for example where the input is a FOA signal, the analysis processor 105 can be configured to determine an intensity vector. The analysis processor may then be configured to determine a direction parameter value for the directional metadata based on the intensity vector. A diffuse-to-total ratio can then be determined, from which a direct-to-total ratio parameter value for the directional metadata can be determined. This analysis method is known in the literature as Directional Audio Coding (DirAC).

In some examples, for example where the input is a HOA signal, the analysis processor 105 can be configured to divide the HOA signal into multiple sectors, in each of which the method above is utilized. This sector-based method is known in the literature as higher order DirAC (HO-DirAC). In these examples, there is more than one simultaneous direction parameter value per time-frequency tile corresponding to the multiple sectors.

Additionally in some embodiments where the input is a loudspeaker surround mix and/or audio object(s) based signal, the analysis processor can be configured to convert the signal into a FOA/HOA signal(s) format and to obtain direction and direct-to-total ratio parameter values as above.

The encoder 107 may comprise an audio encoder core 109 which is configured to receive the transport audio signals 104 and generate a suitable encoding of these audio signals. The encoder 107 can in some embodiments be a computer (running suitable software stored on memory and on at least one processor), or alternatively a specific device utilizing, for example, FPGAs or ASICs. The audio encoding may be implemented using any suitable scheme.

The encoder 107 may furthermore comprise a directional metadata encoder/quantizer 111 which is configured to receive the directional metadata and output an encoded or compressed form of the information. In some embodiments the encoder 107 may further interleave, multiplex to a single data stream or embed the directional metadata within encoded downmix signals before transmission or storage shown in FIG. 1 by the dashed line. The multiplexing may be implemented using any suitable scheme.

In some embodiments the transport signal generator 103 and/or analysis processor 105 may be located on a separate device (or otherwise separate) from the encoder 107. For example in such embodiments the directional metadata (and associated non-directional metadata) parameters associated with the audio signals may be a provided to the encoder as a separate bit-stream.

In some embodiments the transport signal generator 103 and/or analysis processor 105 may be part of the encoder 107, i.e., located inside of the encoder and be on a same device.

In the following description the 'synthesis' part 131 is described as a series of parts however in some embodiments the part may be implemented as functions within the same functional apparatus or part.

In the decoder side, the received or retrieved data (stream) may be received by a decoder/demultiplexer 133. The decoder/demultiplexer 133 may demultiplex the encoded streams and pass the audio encoded stream to a transport signal decoder 135 which is configured to decode the audio signals to obtain the transport audio signals. Similarly the decoder/demultiplexer 133 may comprise a metadata extractor 137 which is configured to receive the encoded directional metadata (for example a direction index representing a direction parameter value) and generate directional metadata.

The decoder/demultiplexer 133 can in some embodiments be a computer (running suitable software stored on memory and on at least one processor), or alternatively a specific device utilizing, for example, FPGAs or ASICs.

The decoded metadata and transport audio signals may be passed to a synthesis processor 139.

The system 100 'synthesis' part 131 further shows a synthesis processor 139 configured to receive the transport audio signal and the directional metadata and re-creates in any suitable format a synthesized spatial audio in the form of multi-channel signals 110 (these may be multichannel loudspeaker format or in some embodiments any suitable output format such as binaural or Ambisonics signals, depending on the use case) based on the transport signals and the directional metadata.

The synthesis processor 139 thus creates the output audio signals, e.g., multichannel loudspeaker signals or binaural signals based on any suitable known method. This is not explained here in further detail. However, as a simplified example, the rendering can be performed for loudspeaker output according to any of the following methods. For example the transport audio signals can be divided to direct and ambient streams based on the direct-to-total and diffuse-to-total energy ratios. The direct stream can then be rendered based on the direction parameter(s) using amplitude panning. The ambient stream can furthermore be rendered using decorrelation. The direct and the ambient streams can then be combined.

The output signals can be reproduced using a multichannel loudspeaker setup or headphones which may be head-tracked.

It should be noted that the processing blocks of FIG. 1 can be located in same or different processing entities. For example, in some embodiments, microphone signals from a mobile device are processed with a spatial audio capture system (containing the analysis processor and the transport signal generator), and the resulting spatial metadata and transport audio signals (e.g., in the form of a MASA stream) are forwarded to an encoder (e.g., an IVAS encoder), which contains the encoder. In other embodiments, input signals (e.g., 5.1 channel audio signals) are directly forwarded to an encoder (e.g., an IVAS encoder), which contains the analysis processor, the transport signal generator, and the encoder.

In some embodiments there can be two (or more) input audio signals, where the first audio signal is processed by the apparatus shown in FIG. 1 (resulting in data as an input for the encoder) and the second audio signal is directly forwarded to an encoder (e.g., an IVAS encoder), which contains the analysis processor, the transport signal generator, and the encoder. The audio input signals may then be encoded in the encoder independently or they may, e.g., be combined in the parametric domain according to what may be called, e.g., MASA mixing.

In some embodiments there may be a synthesis part which comprises separate decoder and synthesis processor entities or apparatus, or the synthesis part can comprise a single entity which comprises both the decoder and the synthesis processor. In some embodiments, the decoder block may process in parallel more than one incoming data stream. In the application the term synthesis processor may be interpreted as an internal or external renderer.

Therefore in summary first the system (analysis part) is configured to receive multi-channel audio signals. Then the system (analysis part) is configured to generate a suitable transport audio signal (for example by selecting some of the audio signal channels). The system is then configured to encode for storage/transmission the transport audio signal. After this the system may store/transmit the encoded transport audio signal and metadata. The system may retrieve/receive the encoded transport audio signal and metadata. Then the system is configured to extract the transport audio signal and metadata from encoded transport audio signal and metadata parameters, for example demultiplex and decode the encoded transport audio signal and metadata parameters.

The system (synthesis part) is configured to synthesize an output multi-channel audio signal based on extracted transport audio signal and metadata.

Figure 2:
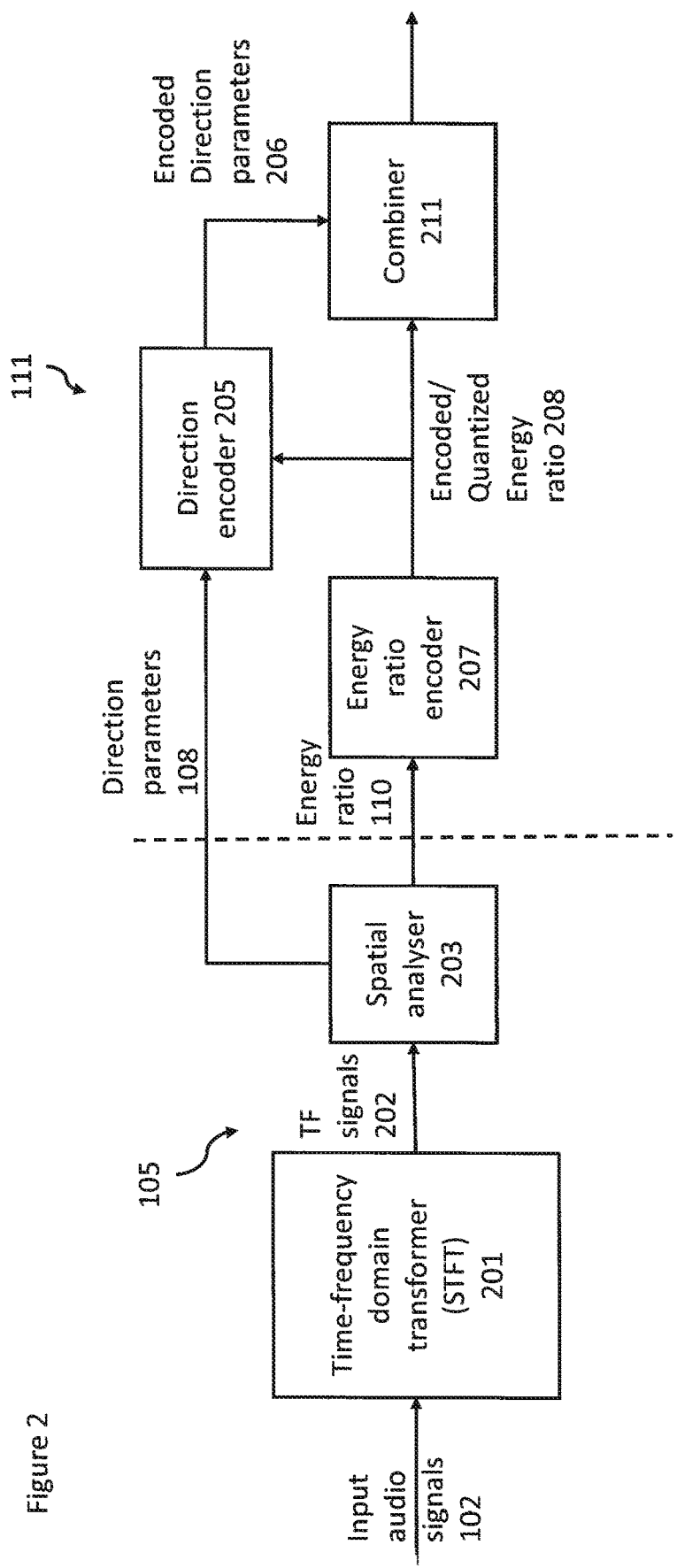
FIG. 2 shows schematically the encoder according to some embodiments.

With respect to FIG. 2 an example analysis processor 105 and Metadata encoder/quantizer 111 (as shown in FIG. 1) according to some embodiments is described in further detail.

The analysis processor 105 in some embodiments comprises a time-frequency domain transformer 201.

In some embodiments the time-frequency domain transformer 201 is configured to receive the multi-channel signals 102 and apply a suitable time to frequency domain transform such as a Short Time Fourier Transform (STFT) in order to convert the input time domain signals into a suitable time-frequency signals. These time-frequency signals may be passed to a spatial analyser 203 and to a signal analyser 205.

Thus for example the time-frequency signals 202 may be represented in the time-frequency domain representation by $s_i(b,n)$, where b is the frequency bin index and n is the time-frequency block (frame) index and i is the channel index. In another expression, n can be considered as a time index with a lower sampling rate than that of the original time-domain signals. These frequency bins can be grouped into subbands that group one or more of the bins into a subband of a band index k=0, ..., K−1. Each subband k has a lowest bin $b_{k,low}$ and a highest bin $b_{k,high}$, and the subband contains all bins from $b_{k,low}$ to $b_{k,high}$. The widths of the subbands can approximate any suitable distribution. For example the Equivalent rectangular bandwidth (ERB) scale or the Bark scale.

In some embodiments the analysis processor 105 comprises a spatial analyser 203. The spatial analyser 203 may be configured to receive the time-frequency signals 202 and based on these signals estimate direction parameters 108. The direction parameters may be determined based on any audio based 'direction' determination.

For example in some embodiments the spatial analyser 203 is configured to estimate the direction with two or more signal inputs. This represents the simplest configuration to estimate a 'direction', more complex processing may be performed with even more signals.

The spatial analyser 203 may thus be configured to provide at least one azimuth and elevation for each frequency band and temporal time-frequency block within a frame of an audio signal, denoted as azimuth $\varphi(k,n)$ and elevation $\theta(k,n)$. The direction parameters 108 may be also be passed to a direction index generator 205.

The spatial analyser 203 may also be configured to determine an energy ratio parameter 110. The energy ratio may be considered to be a determination of the energy of the audio signal which can be considered to arrive from a direction. The direct-to-total energy ratio $r(k,n)$ can be estimated, e.g., using a stability measure of the directional estimate, or using any correlation measure, or any other suitable method to obtain a ratio parameter. The energy ratio may be passed to an energy ratio encoder 207.

The spatial analyser 203 may furthermore be configured to determine a number of coherence parameters 112 which may include surrounding coherence ($\gamma(k,n)$) and spread coherence ($\zeta(k, n)$), both analysed in time-frequency domain.

Therefore in summary the analysis processor is configured to receive time domain multichannel or other format such as microphone or ambisonic audio signals.

Following this the analysis processor may apply a time domain to frequency domain transform (e.g. STFT) to generate suitable time-frequency domain signals for analysis and then apply direction analysis to determine direction and energy ratio parameters.

The analysis processor may then be configured to output the determined parameters.

Although directions, energy ratios, and coherence parameters are here expressed for each time index n, in some embodiments the parameters may be combined over several time indices. Same applies for the frequency axis, as has been expressed, the direction of several frequency bins b could be expressed by one direction parameter in band k consisting of several frequency bins b. The same applies for all of the discussed spatial parameters herein.

In some embodiments the directional data may be represented using 16 bits such that the each azimuth parameter is approximately represented on 9 bits, and the elevation on 7 bits. In such embodiments the energy ratio parameter may be represented on 8 bits. For each frame there may be N subbands (where N may be between 1 and 24 and may be fixed at 5), and M time frequency (TF) blocks (where the value of M may be M=4). Thus in this example there are (16+8)×M×N bits needed to store the uncompressed direction and energy ratio metadata for each frame.

As also shown in FIG. 2 an example metadata encoder/quantizer 111 is shown according to some embodiments.

The metadata encoder/quantizer 111 may comprise a direction encoder 205. The direction encoder 205 is configured to receive the direction parameters (such as the azimuth $\varphi(k, n)$ and elevation $\theta(k, n)$ 108 (and in some embodiments an expected bit allocation) and from this generate a suitable encoded output. In some embodiments the encoding is based on an arrangement of spheres forming a spherical grid arranged in rings on a 'surface' sphere which are defined by a look up table defined by the determined quantization resolution. In other words the spherical grid uses the idea of covering a sphere with smaller spheres and considering the centres of the smaller spheres as points defining a grid of almost equidistant directions. The smaller spheres therefore define cones or solid angles about the centre point which can be indexed according to any suitable indexing algorithm. Although spherical quantization is described here any suitable quantization, linear or non-linear may be used.

The quantized values may then be further combined by determining whether corresponding directional parameter elevation values are similar enough to employ the embedded flexible border codebook.

The encoded direction parameters 206 may then be passed to the combiner 211.

The metadata encoder/quantizer 111 may comprise an energy ratio encoder 207. The energy ratio encoder 207 is configured to receive the energy ratios and determine a suitable encoding for compressing the energy ratios for the sub-bands and the time-frequency blocks. For example in some embodiments the energy ratio encoder 207 is configured to use 3 bits to encode each energy ratio parameter value.

Furthermore in some embodiments rather than transmitting or storing all energy ratio values for all TF blocks, only one weighted average value per sub-band is transmitted or stored. The average may be determined by taking into account the total energy of each time block, favouring thus the values of the sub-bands having more energy.

In such embodiments the quantized energy ratio value 208 is the same for all the TF blocks of a given sub-band.

In some embodiments the energy ratio encoder 207 is further configured to pass the quantized (encoded) energy ratio value 208 to the combiner 211.

The metadata encoder/quantizer 111 may comprise a combiner 211. The combiner is configured to receive the encoded (or quantized/compressed) directional parameters and energy ratio parameters and combine these to generate a suitable output (for example a metadata bit stream which may be combined with the transport signal or be separately transmitted or stored from the transport signal).

Figure 3:
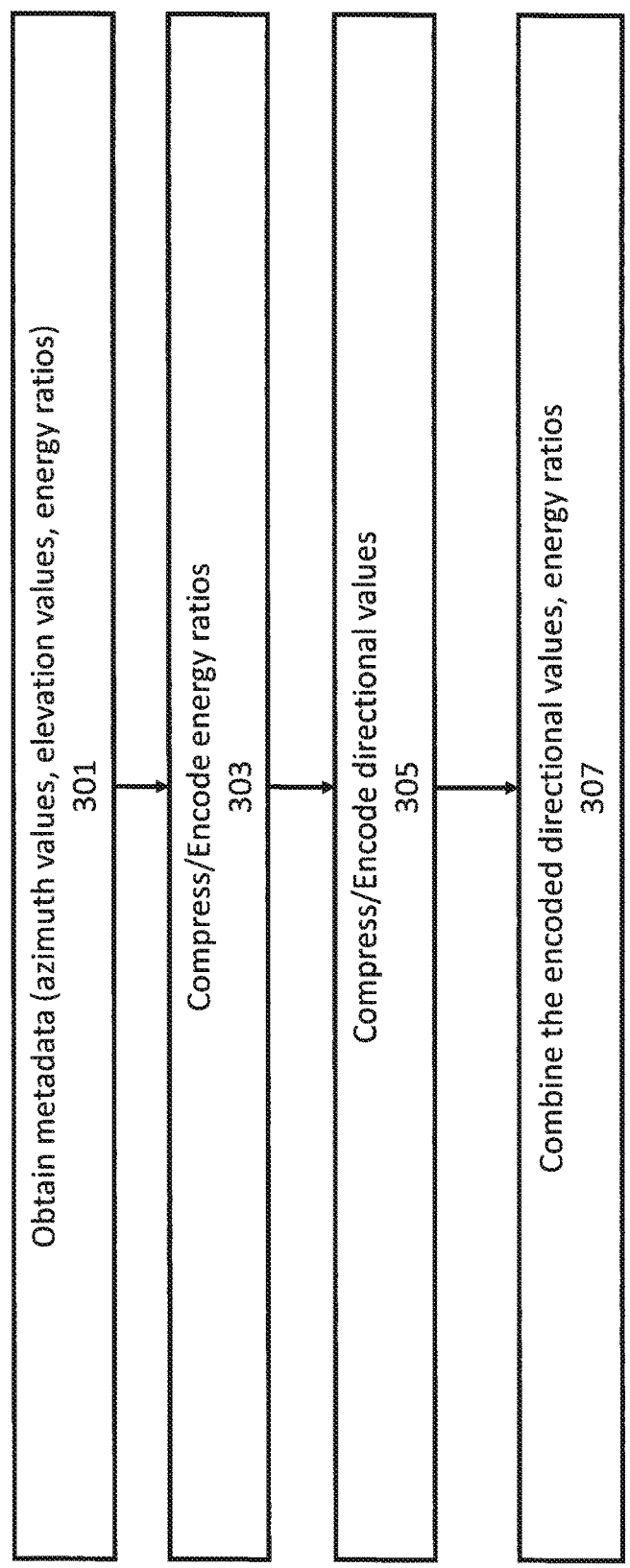
FIG. 3 shows a flow diagram of the operations of the encoder as shown in FIG. 2 according to some embodiments.

With respect to FIG. 3 is shown an example operation of the metadata encoder/quantizer as shown in FIG. 2 according to some embodiments.

The initial operation is obtaining the metadata (such as azimuth values, elevation values, energy ratios, etc) as shown in FIG. 3 by step 301.

The directional values (elevation, azimuth) may then be compressed or encoded (for example by applying a spherical quantization, or any suitable compression) as shown in FIG. 3 by step 303.

The energy ratio values are compressed or encoded (for example by generating a weighted average per sub-band and then quantizing these as a 3 bit value) as shown in FIG. 3 by step 305.

The encoded directional values, energy ratios, coherence values are then combined to generate the encoded metadata as shown in FIG. 3 by step 307.

Figure 4:
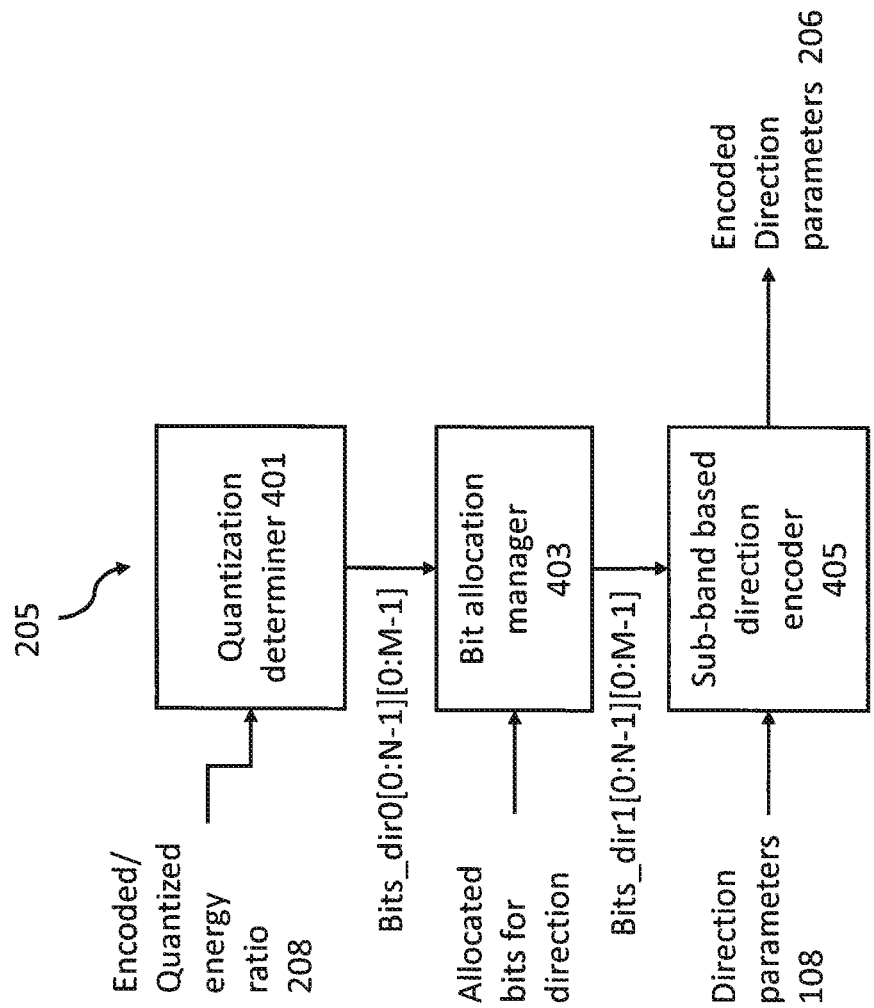
FIG. 4 shows schematically the direction encoder as shown in FIG. 2 according to some embodiments.

The direction encoder 205 is shown in further detail with respect to FIG. 4.

The direction encoder may in some embodiments comprise a quantization determiner 401. The quantization determiner is configured to receive the encoded/quantized energy ratio 208 for each sub-band and from this value determine the quantization resolution for the azimuth and the elevation for all the time block of the current sub-band. The quantization resolution is set by allowing a predefined number of bits given by the value of the energy ratio, bits_dir0[0:N-1][0:M-1]. This can be output to a bit allocation manager 403.

The direction encoder 205 may furthermore comprise a bit allocation manager 403 configured to receive the determined quantization resolution for the azimuth and the elevation for all the time block of the current sub-band based on the energy ratio value bits_dir0[0:N-1][0:M-1] and the allocated bits for the frame and modify the quantization resolution that the allocated number of bits is reduced to bits_dir1[0:N-1][0:M-1] such that the sum of the allocated bits equals the number of available bits left after encoding the energy ratios. The reduced bit allocation bits_dir1[0:N-1][0:M-1] can then be passed to the sub-band based direction encoder 403.

The direction encoder 205 may furthermore comprise a sub-band based direction encoder 405 configured to receive the (reduced) bit allocation from the bit allocation manager 403. The sub-band based direction encoder 405 is also configured to receive the direction parameters 108 and encode them based on the bit allocation on a sub-band by sub-band basis.

Figure 5:
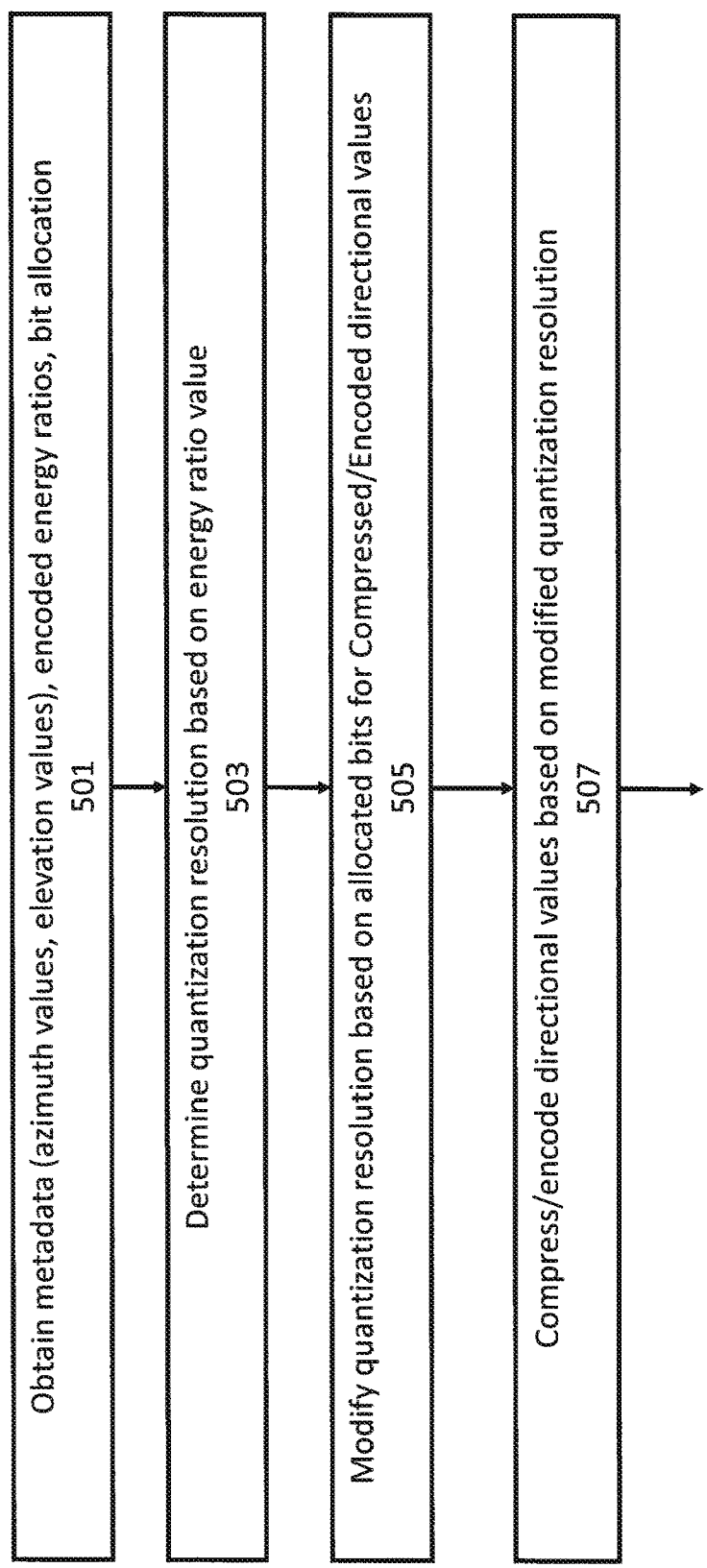
FIG. 5 shows a flow diagram of the operations of the direction encoder as shown in FIG. 4 according to some embodiments.

With respect to FIG. 5 is shown a flow diagram showing the operations of the direction encoder 205 as shown in FIG. 4.

The initial operation is obtaining the direction metadata (such as azimuth values, elevation values, etc), the encoded energy ratio values and the bit allocation as shown in FIG. 5 by step 501.

The quantization resolution is then initially determined based on the energy ratio value as shown in FIG. 5 by step 503.

The quantization resolution can then be modified based on the allocated bits for the frame as shown in FIG. 5 by step 505.

The direction parameters can then be compresses/encoded on a sub-band by sub-band basis based on the modified quantized resolution as shown in FIG. 5 by step 507.

Figure 6:
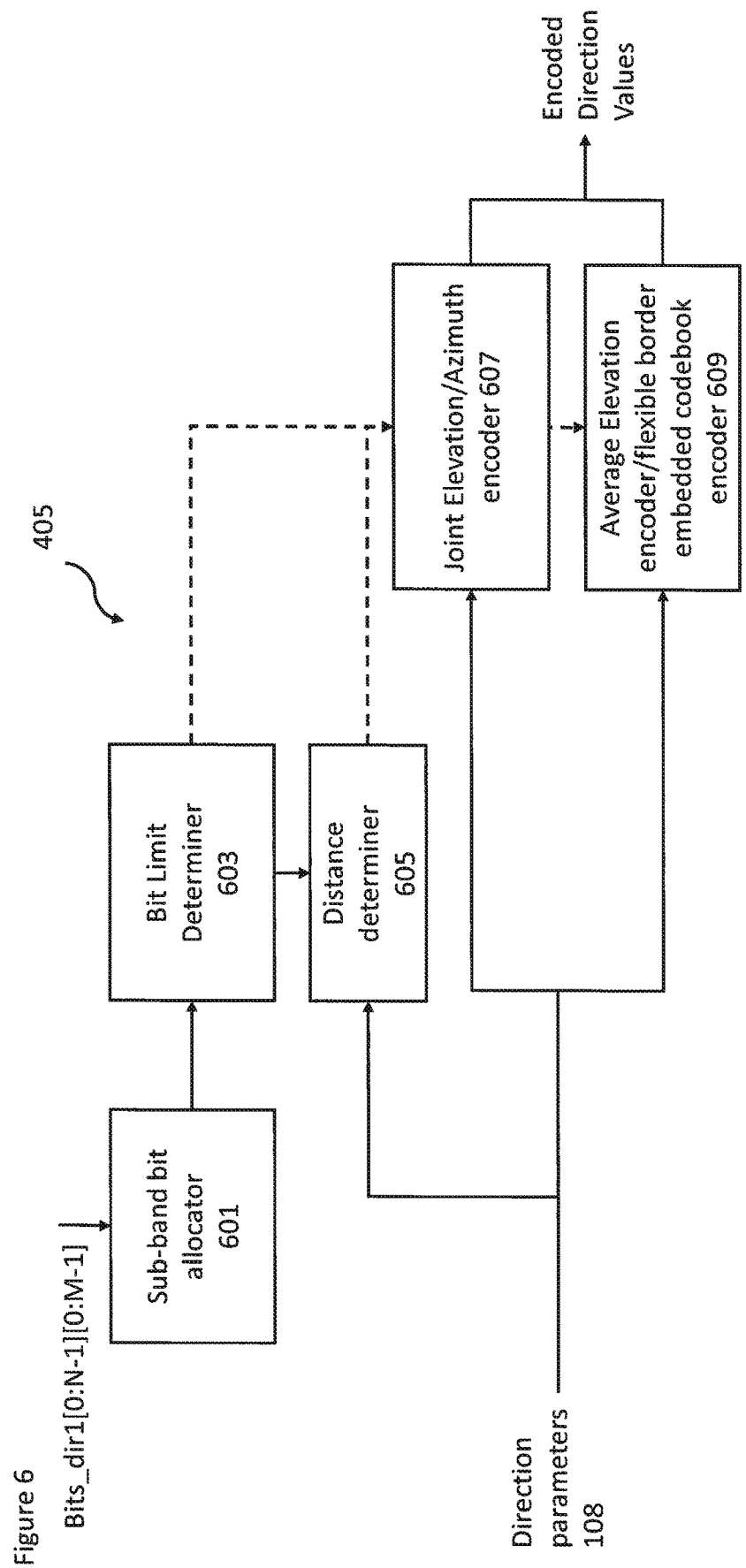
FIG. 6 shows schematically the flexible border codebook encoder part of the direction encoder as shown in FIGS. 2 and 4 according to some embodiments.

With respect to FIG. 6 is shown the sub-band based direction encoder 405 as shown in FIG. 4 in further detail.

The sub-band based direction encoder 405 in some embodiments comprises a sub-band bit allocator 601. The sub-band bit allocator 601 is configured to receive the (reduced) bit allocation bits_dir1[0:N-1][0:M-1] and determine the allowed number of bits for the sub-band. For example the bits_allowed=sum(bits_dir1[i][0:M-1]).

The sub-band based direction encoder 405 in some embodiments comprises a bit limit determiner 603. The bit limit determiner 603 is configured to find a maximum number of bits allocated for each TF block of the current sub-band max_b=max(bits_dir1[i][0:M-1]) and furthermore determine whether the maximum number of bits allocated for each TF block of the current sub-band is less than or equal to a determined limit number of bits. In other whether max_b<=LIMIT_BITS_PER_TF. The value of the determined limit number of bits LIMIT_BITS_PER_TF is the limit number of bits per time frequency (TF) tile at which a decision is made as to whether to use an embedded quantizer instead of a joint encoding. For instance for an example array of TF tiles (blocks) where M=4 in a sub-band the number of bits in the tiles can be (3 2 1 3) respectively or (3 3 3 3) or (2 1 1 2) when LIMIT_BITS_PER_TF_=3 then the method may start to check whether an embedded quantizer can be used.

The sub-band based direction encoder 405 in some embodiments comprises a distance determiner 605. The distance determiner 605 may be controlled by the bit limit determiner 603 such that when where the maximum number of bits allocated for each TF block of the current sub-band is less than or equal to the bits allowed then distances d1 d2 are determined. Where the angular distance is calculated as $$d = \cos \widehat{\theta_{av}} \cos \theta_i \cos(\phi_i - \hat{\phi}_i) - \sin \theta_i \sin \widehat{\theta_{av}}$$

where $\theta_{av}$ is the average elevation. The d1 distance is the estimate of the quantization distortion when using the joint encoding and the d2 distance the estimate of the quantization distortion when using a flexible embedded codebook.

In some embodiments the estimations are made based on the unquantized angles and the actual values in each of the codebook, without calculating the quantized values.

In some embodiments the variance of the elevation is considered, because if its variance is larger than a determined value then more than one elevation value for the sub-band is encoded. This is further detailed in PCT/FI2019/050675.

The distance determiner 605 is configured to determine whether the distance d2 is less than the distance d1.

The sub-band based direction encoder 405 in some embodiments comprises a joint elevation/azimuth encoder 607. The joint elevation/azimuth encoder 607 can be controlled by the bit limit determiner 603 determination to jointly encode the elevation and azimuth values of each TF block within the number of bits allotted for the current sub-band when the maximum number of bits allocated for each TF block of the current sub-band is more than to the bits allowed.

Additionally the joint elevation/azimuth encoder 607 can be controlled by the distance determiner 605 to jointly encode the elevation and azimuth values of each TF block within the number of bits allotted for the current sub-band when the distance d2 is more than the distance d1. In other words to jointly encode when the estimate of the quantization distortion when using the joint encoding is less than the estimate of the quantization distortion when using a flexible embedded codebook.

The sub-band based direction encoder 405 in some embodiments comprises an average elevation encoder/flexible border embedded codebook encoder 609. The average elevation encoder/flexible border embedded codebook encoder 609 can receive the distances and the direction parameters and be operative to determine based on the distance determiner 605 distance d2 is more than the distance d1 (and when the maximum number of bits allocated for each TF block of the current sub-band is less than or equal to the bits allowed).

The average elevation encoder/flexible border embedded codebook encoder 609 in some embodiments is configured to encode the average elevation value with 1 or 2 bits (1 bit for value 0 degrees, 2 bits for +/−36 degrees). Additionally the average elevation encoder/flexible border embedded codebook encoder 609 is configured to employ a flexible borders embedded codebook for the azimuth values of each of the considered TF tiles.

Figure 7:
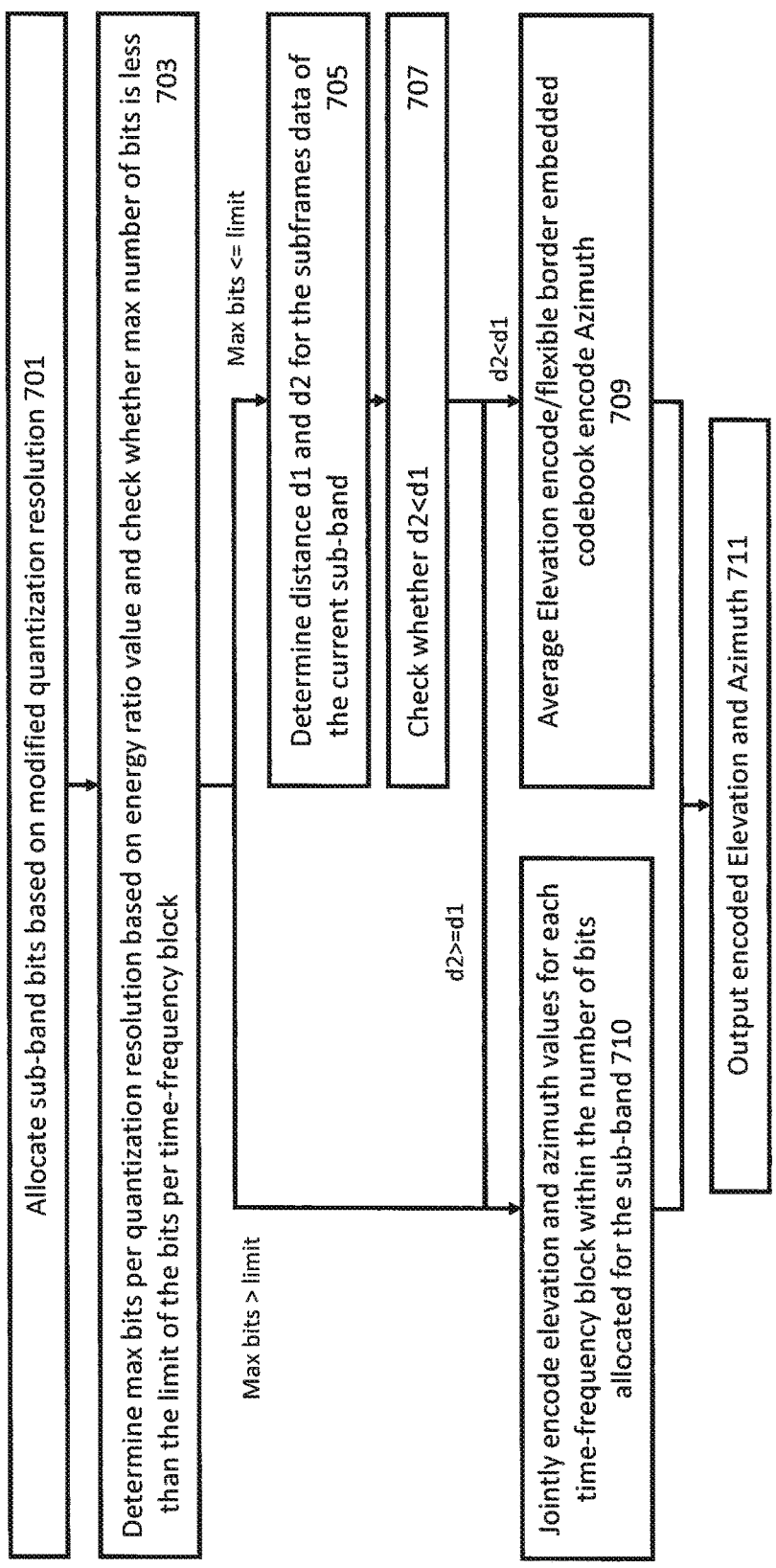
FIG. 7 shows a flow diagram of the operations of the flexible border codebook encoder part encoder as shown in FIG. 6 according to some embodiments.

The operations of the sub-band based direction encoder 405 is further described with respect to the flow diagram shown in FIG. 7.

An initial operation may be to allocate sub-band bits based on modified quantization resolution as shown in FIG. 7 by step 701.

Then a max bits per quantization resolution based on energy ratio value is determined and a check performed whether max number of bits is less than the limit of the bits per time-frequency block as shown in FIG. 7 by step 703.

Where the check determines that the maximum number of bits is greater than the limit then the elevation and azimuth values are jointly encoded for each time-frequency block within the number of bits allocated for the sub-band as shown in FIG. 7 by step 710.

Where the check determines that the maximum number of bits is less than or equal to the limit then the distances d1 and d2 are determined for the sub-frames of the current sub-band.

Then there is a check on whether d2<d1 as shown in FIG. 7 by step 707.

Where the distance d2>=d1 then the elevation and azimuth values are jointly encoded for each time-frequency block within the number of bits allocated for the sub-band as shown in FIG. 7 by step 710.

Where the distance d2<d1 then the average elevation value is encoded with 1 or 2 bits (1 bit for value 0 degrees, 2 bits for +/−36 degrees) and the azimuth values are encoded using a flexible borders embedded codebook for each of the considered TF tiles as shown in FIG. 7 by step 709.

The sub-band encoded values can then be output as shown in FIG. 7 by step 711.

An example pseudocode form of the energy ratio/direction encoding operations may be as follows:

```
1.  For each sub-band i=1:N
       a.  Use 3 bits to encode the corresponding energy ratio value
       b.  Set the quantization resolution for the azimuth and the elevation for all
           the time block of the current sub-band. The quantization resolution is
           set by allowing a predefined number of bits given by the value of the
           energy ratio, bits_dir0[0:N-1][0:M-1]
2.  End for
3.  Reduce the allocated number of bits, bits_dir1[0:N-1][0:M-1], such that the
    sum of the allocated bits equals the number of available bits left after
    encoding the energy ratios
4.  For each sub-band i=1:N
       a.  Calculate allowed bits for current sub-band: bits_allowed=
           sum(bits_dir1[i][0:M-1])
       b.  Find maximum number of bits allocated for each TF block of the
           current sub-band max_b = max(bits_dir1[i][0:M-1]);
       c.  If (max_b <= LIMIT_BITS_PER_TF)
              i.  Calculate two distances d1 and d2 for the subframes data of
                  the current sub-band
              ii. If d2 < d1
                    1.  Encode the average elevation value with 1 or 2 bits (1
                        bit for value 0 degrees, 2 bits for +/−36 degrees)
                    2.  Use the flexible borders embedded codebook for the
                        azimuth values of each of the considered TF tiles.
              iii. Else
                    1.  Jointly encode the elevation and azimuth values of each
                        TF block within the number of bits allotted for the current
                        sub-band.
              iv. End if
       d.  Else
              i.  Jointly encode the elevation and azimuth values of each TF
                  block within the number of bits allotted for the current sub-band.
       e.  End if
5.  End for
```

Figure 8:
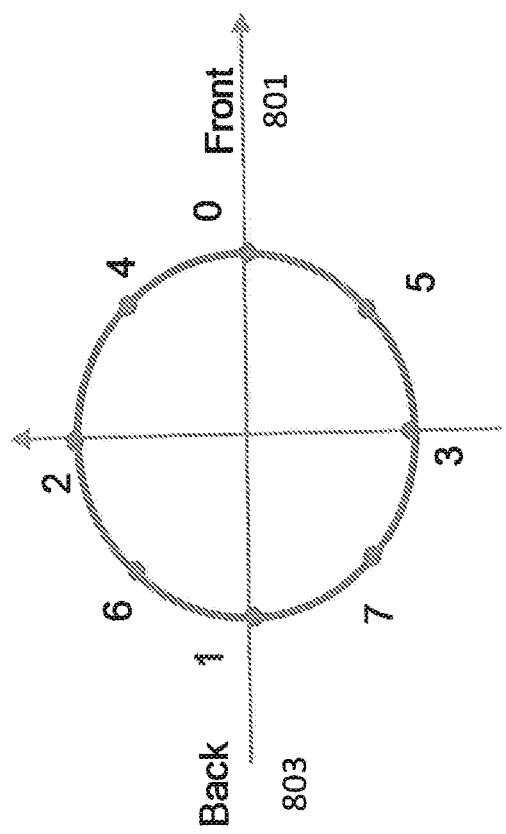
FIG. 8 shows an example codebook angular allocation according to some embodiments.

An example of an embedded codebook for azimuth is shown with respect to FIG. 8. The example show the 1 bit codebook (indices 0 and 1) covers the front 801 and back 803 directions. The 2 bit codebooks further add in a left and right directions (indices 2 and 3). The 3 bit codebook furthermore adds in a mid left and right for the front and back directions (indices 4,5,6,7).

Figure 9:
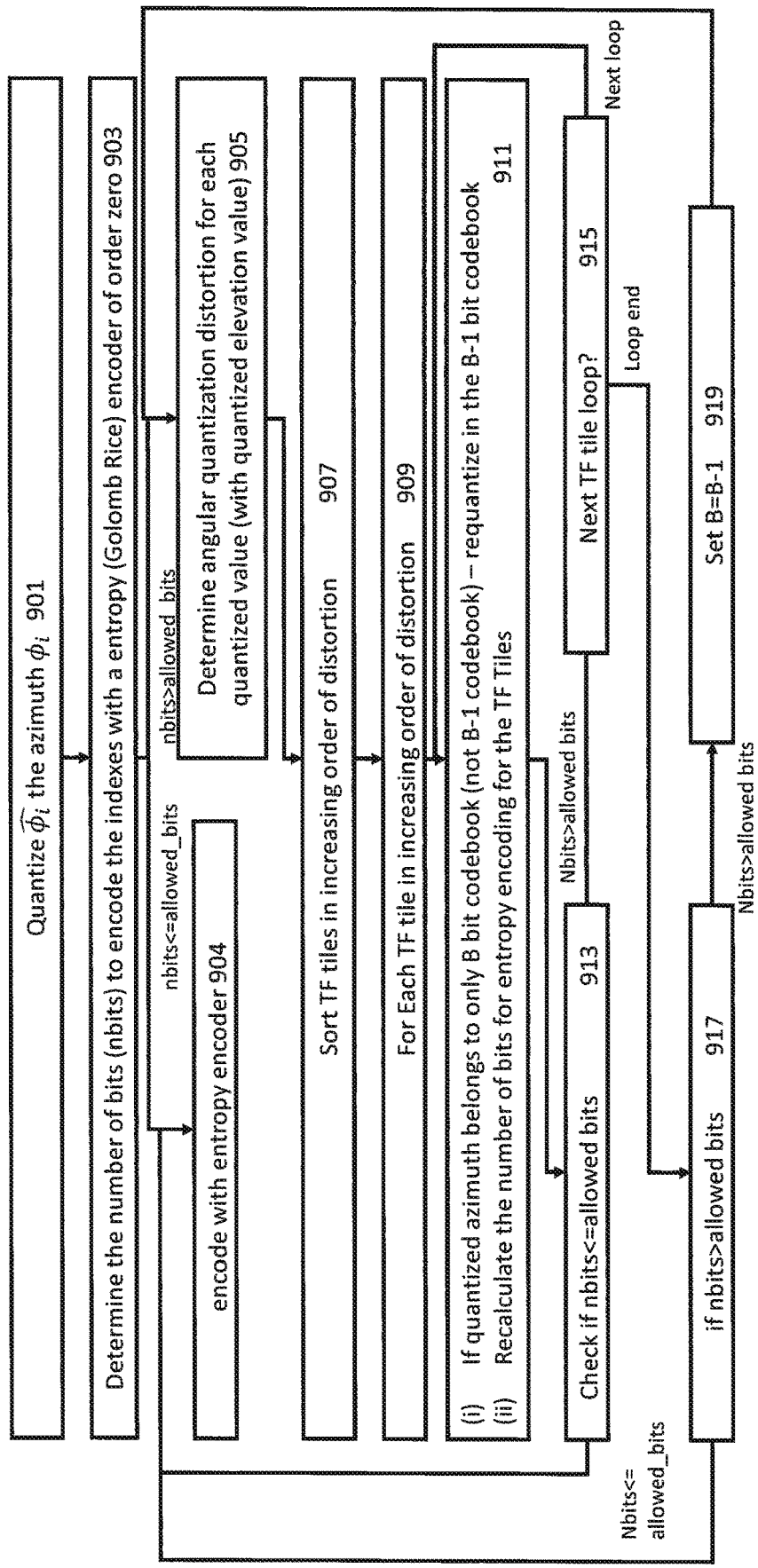
FIG. 9 shows a further flow diagram of the operations of the flexible border codebook selection for the encoder as shown in FIG. 6 according to some embodiments.

The selection of which codebook to encode the azimuth values based on the embedded codebook can be shown by the method example shown in FIG. 9.

A first operation is to quantize $\hat{\phi}_i$ the azimuth $\phi_i$ using the B-bits codebook as shown in FIG. 9 by step 901.

The next operation is one of determining the number of bits (nbits) which are required to encode the indexes with an entropy encoder, for example a Golomb Rice encoder of order zero. The number of bits (nbits) are then checked against the allowed number of bits (allowed_bits) is shown in FIG. 9 by step 903.

Where the nbits<=allowed_bits then the entropy encoding is performed using the indices as shown in FIG. 9 by step 904.

Where the nbits>allowed_bits then the angular quantization distortion for each of the quantized values taking into account the quantized elevation value is calculated as shown in FIG. 9 by step 905.

Then the time-frequency tiles are sorted in increasing order of their angular quantization distortion as shown in FIG. 9 by step 907.

Then a loop for each time-frequency tile in increasing order of their angular quantization distortion is started as shown in FIG. 9 by step 909.

The loop determines that if the quantized azimuth belongs only to the B bit codebook, but not to the B-1 bit codebook, then it is re-quantized in the B-1 bit codebook and then a number of bits required to encode the (re-quantized) indexes with an entropy encoder (such as the Golomb Rice encoder) is recalculated as shown in FIG. 9 by step 911.

A check is then made to determine whether the number of bits (nbits) is less than or equal to the allowed bits as shown in FIG. 9 by step 913.

Where the check determines that the number of bits (nbits) is less than or equal to the allowed bits then entropy encoding is performed using the indices as shown in FIG. 9 by step 904.

Where the check determines that the number of bits (nbits) is more than the allowed bits then the loop is checked as shown in FIG. 9 by step 915.

Where there are further TF tiles to be tested then the loop returns to the next increasing angular quantization distortion value.

Where there are no further TF tiles to be processed then a further check is then made to determine whether the number of bits (nbits) is less than or equal to the allowed bits as shown in FIG. 9 by step 917.

Where the check determines that the number of bits (nbits) is less than or equal to the allowed bits then entropy encoding is performed using the indices as shown in FIG. 9 by step 904.

Where the check determines that the number of bits (nbits) is more than to the allowed bits then the codebook level is reduced, set B=B−1 as shown in FIG. 9 by step 919 and the angular quantization distortion is estimated for each quantized value for the new quantized values.

This can be summarized by the pseudocode

1. Quantize to $\hat{\phi}_i$ the azimuth $\phi_i$ in the B bits codebook
2. Calculate the number of bits, nbits, needed to encode the resulting indexes with a Golomb Rice encoder of order zero
3. If nbits > allowed_bits
    a. Calculate the angular quantization distortion for each of the quantized values taking into account the quantized elevation value
    b. Sort the TF tiles in increasing order of their angular quantization distortion
    c. For each TF tile in increasing order of the distortion
        i. If the quantized azimuth belongs only to the B bit codebook, but not to the B-1 bit codebook, re-quantize in the B-1 bit codebook
        ii. Recalculate the number of bits for GR encoding for the TF tiles
        iii. If nbits <= allowed bits
            1. Break
        iv. End if
    d. End for
    e. If nbits > allowed bits
        i. B = B-1;
        ii. Go to 3.a
    f. End if
4. End if An example c-code implementation may be

```
        short truncGR0(float * data, float * data_hat, unsigned short * data_idx, short
len, short bits_allowed, float * st, float * ct)
{
  short i;
  short bits;
  short i_az;
  short remap3b[ ] = { 1,6,2,4,0,5,3,7 }, remap2b[ ] = {1,2,0,3};
  float diff[MASA_SUBFRAMES];
  int indx[MASA_SUBFRAMES];
  i_az = 0;
  bits = 0;
  set_f(data_hat, 0.0f, len);
  set_f(diff, 10000.0f, len);
  for (i = 0; i < len; i++)
  {
    if (data_idx[i] < MASA_NO_INDEX) /* MASA_NO_INDEX signals the case
when there is no need to encode the index because e.g. it has a default value */
    {
      data_idx[i] = quantize_phi(data[i]+180, 0, &data_hat[i], 8);
      data_hat[i] -= 180;
      data_idx[i] = remap3b[data_idx[i]];
      bits += 1 + data_idx[i];
      i_az++;
      diff[i] = -st[i] - ct[i]*cos(data[i] - data_hat[i]); /*(data[i] - data_hat[i])*(data[i] -
data_hat[i]);*/
    }
  }
  if (bits_allowed < i_az)
  {
    bits = bits_allowed;
    for (i = 0; i < len; i++)
    {
```

```
          if (data_idx[i] < MASA_NO_INDEX)
          {
            data_idx[i] = 0;
            data_hat[i] = 0.0f;
          }
        }
      return bits;
    }
    i = 0;
    if (bits > bits_allowed)
    {
      sort_desc_ind(diff, len, indx);
      for (i = len−1; i >= 0; i−−)
      {
        if (data_idx[indx[i]] < MASA_NO_INDEX)
        {
          if (data_idx[indx[i]] > 3)
          {
            bits −= data_idx[indx[i]];
            data_idx[indx[i]] = quantize_phi(data[indx[i]] + 180, 0,
&data_hat[indx[i]], 4);
            data_hat[indx[i]] −= 180;
            data_idx[indx[i]] = remap2b[data_idx[indx[i]]];
            bits += data_idx[indx[i]];
            diff[indx[i]] = −st[i] − ct[i] * cos(data[i] − data_hat[i]);
          }
          if (bits <= bits_allowed)
          {
            break;
          }
        }
      }
    }
    if (bits > bits_allowed)
    {
      sort_desc_ind(diff, len, indx);
      for (i = len − 1; i >= 0; i−−)
      {
        if (data_idx[indx[i]] < MASA_NO_INDEX)
        {
          if (data_idx[indx[i]] > 1)
          {
            bits −= data_idx[indx[i]];
            if (fabs(data[indx[i]]) <= 90)
            {
              data_idx[indx[i]] = 0;
              data_hat[indx[i]] = 0;
            }
            else
            {
              data_idx[indx[i]] = 1;
              data_hat[indx[i]] = −180;
            }
            bits += data_idx[indx[i]];
            diff[indx[i]] = −st[i] − ct[i] * cos(data[i] − data_hat[i])
          }
          if (bits <= bits_allowed)
          {
            break;
          }
        }
      }
    }
    if (bits > bits_allowed)
    {
      sort_desc_ind(diff, len, indx);
      for (i = len − 1; i >= 0; i−−)
      {
        if (data_idx[indx[i]] < MASA_NO_INDEX)
        {
          if (data_idx[indx[i]] > 0)
          {
            bits −= data_idx[indx[i]];
            data_idx[indx[i]] = 0;
            data_hat[indx[i]] = 0;
          }
```

```
          if (bits <= bits_allowed)
          {
            break;
          }
        }
      }
    }
  }
  return bits;
}
short common_direction(IVAS_QDIRECTION * qdirection
  short band_idx,
  short len,
  short bits_allowed,
  BSTR_ENC_HANDLE hMasaMetaData,
  float* elevation_orig,
  float * azimuth_orig
  )
{
  short nbits;
  float av_el;
  short no_th, i, id_th, k;
  float theta_cb[3];
  short data, bits_crt;
  float dist, best_dist;
  float ct[MASA_SUBFRAMES], st[MASA_SUBFRAMES];
  nbits = 0;
  if (bits_allowed = = 0)
  {
    for (i = 0; i < len; i++)
    {
      qdirection->elevation[band_idx][i] = 0;
      qdirection->azimuth[band_idx][i] = 0;
    }
    return 0;
  }
  /* if less than 5 bits are available then the elevation is zero and all bits are used
for azimuth */
  if (bits_allowed <= 5)
  {
    set_f(qdirection->elevation[band_idx], 0.0f, len);
    set_f(st, 0.0f, len);
    for (i = 0; i < len; i++)
    {
      ct[i] = cos(elevation_orig[i]);
    }
    nbits = truncGR0(azimuth_orig, qdirection->azimuth[band_idx], qdirection-
>azimuth_index[band_idx], len, bits_allowed, st, ct);
    return nbits;
  }
  av_el = mean(qdirection->elevation[band_idx], len);
  no_th = no_theta_masa[0] +1 ; /* only 3 values for theta */
  theta_cb[0] = 0;
  theta_cb[1] = delta_theta_masa[2];
  theta_cb[2] = -theta_cb[1];
  best_dist = 500000.0f;
  id_th = 0;
  for (i = 0; i < no_th; i++)
  {
    dist = 0.0f;
    for (k = 0; k < len; k++)
    {
      dist += (elevation_orig[k] - theta_cb[i])* (elevation_orig[k] - theta_cb[i]);
    }
    if (dist < best_dist)
    {
      id_th = i;
      best_dist = dist;
    }
  }
  set_f(qdirection->elevation[band_idx], theta_cb[id_th], len);
  for (i = 0; i < len; i++)
  {
    qdirection->elevation_index[band_idx][i] =id_th;
  }
  if (id_th = = 0)
  {
    push_next_indice(hMasaMetaData, 0, 1); /* average theta index */
    set_f(st, 0.0f, len);
    for (i = 0; i < len; i++)
```

```
    {
       ct[i] = cos(elevation_orig[i]);
    }
    nbits = truncGR0(azimuth_orig, qdirection->azimuth[band_idx], qdirection-
>azimuth_index[band_idx], len, bits_allowed-1, st, ct) +1;
  }
  else
  {
    set_f(st, sin(theta_cb[id_th]), len);
    set_f(ct, cos(theta_cb[id_th]), len);
    for (i = 0; i < len; i++)
    {
       st[i] *= sin(elevation_orig[i]);
       ct[i] *= cos(elevation_orig[i]);
    }
    push_next_indice(hMasaMetaData, id_th+1,2); /* average theta index */
    nbits = truncGR0(azimuth_orig,qdirection->azimuth[band_idx], qdirection-
>azimuth_index[band_idx], len, bits_allowed-2, st, ct) +2;
  }
  data = 0;
  for (i = 0; i < len; i++)
  {
    if (qdirection->azimuth_index[band_idx][i] < MASA_NO_INDEX)
    {
       data = GR_data(data, 0, &bits_crt);
       push_next_indice(hMasaMetaData, data, bits_crt);
    }
  }
  return nbits;
}
```

With respect to the decoder the metadata decoder may be configured to determine whether the average elevation is signaled and then the average elevation is read on 1 or 2 bits '0' for value 0, '10' for value +36 and '11' for value −36. Other values, in place of 36 degrees can also be used. Furthermore in some embodiments there may be used more than one bit to encode the average elevation and thus have between 5 values to select from −0,+/−+theta_1, +/−\theta_2 and then the indexes for the azimuth are read with the Golomb Rice of order 0 decoder and no further signaling for which codebook they belong being needed.

The embodiments as discussed herein thus enables both the significant reduction of the table ROM for the encoding of directions as well as a reduction by up to 30% of the resulting angular quantization distortion enabled by the fact that the optimization is done in the angular distortion space and each component is individually checked.

Figure 10:
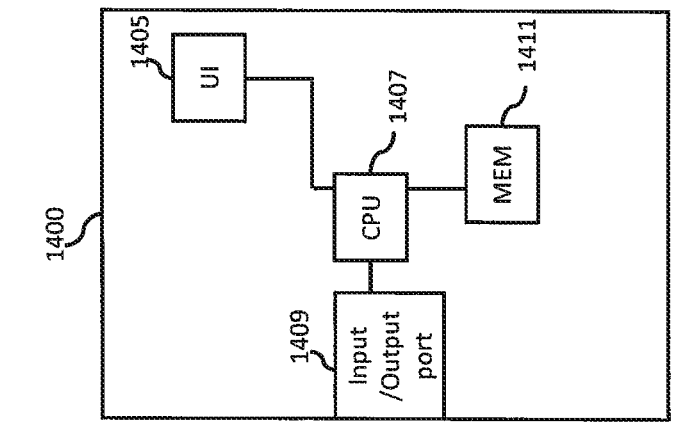
FIG. 10 shows schematically an example device suitable for implementing the apparatus shown.

With respect to FIG. 10 an example electronic device which may be used as the analysis or synthesis device is shown. The device may be any suitable electronics device or apparatus. For example in some embodiments the device 1400 is a mobile device, user equipment, tablet computer, computer, audio playback apparatus, etc.

In some embodiments the device 1400 comprises at least one processor or central processing unit 1407. The processor 1407 can be configured to execute various program codes such as the methods such as described herein.

In some embodiments the device 1400 comprises a memory 1411. In some embodiments the at least one processor 1407 is coupled to the memory 1411. The memory 1411 can be any suitable storage means. In some embodiments the memory 1411 comprises a program code section for storing program codes implementable upon the processor 1407. Furthermore in some embodiments the memory 1411 can further comprise a stored data section for storing data, for example data that has been processed or to be processed in accordance with the embodiments as described herein. The implemented program code stored within the program code section and the data stored within the stored data section can be retrieved by the processor 1407 whenever needed via the memory-processor coupling.

In some embodiments the device 1400 comprises a user interface 1405. The user interface 1405 can be coupled in some embodiments to the processor 1407. In some embodiments the processor 1407 can control the operation of the user interface 1405 and receive inputs from the user interface 1405. In some embodiments the user interface 1405 can enable a user to input commands to the device 1400, for example via a keypad. In some embodiments the user interface 1405 can enable the user to obtain information from the device 1400. For example the user interface 1405 may comprise a display configured to display information from the device 1400 to the user. The user interface 1405 can in some embodiments comprise a touch screen or touch interface capable of both enabling information to be entered to the device 1400 and further displaying information to the user of the device 1400. In some embodiments the user interface 1405 may be the user interface for communicating with the position determiner as described herein.

In some embodiments the device 1400 comprises an input/output port 1409. The input/output port 1409 in some embodiments comprises a transceiver. The transceiver in such embodiments can be coupled to the processor 1407 and configured to enable a communication with other apparatus or electronic devices, for example via a wireless communications network. The transceiver or any suitable transceiver or transmitter and/or receiver means can in some embodiments be configured to communicate with other electronic devices or apparatus via a wire or wired coupling.

The transceiver can communicate with further apparatus by any suitable known communications protocol. For example in some embodiments the transceiver can use a suitable universal mobile telecommunications system (UMTS) protocol, a wireless local area network (WLAN) protocol such as for example IEEE 802.X, a suitable shortrange radio frequency communication protocol such as Bluetooth, or infrared data communication pathway (IRDA).

The transceiver input/output port 1409 may be configured to receive the signals and in some embodiments determine the parameters as described herein by using the processor 1407 executing suitable code.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising at least one processor and at least one memory including computer program code, the at least one memory and the computer program code configured to, with the at least one processor, cause the apparatus to:
obtain direction parameter values associated with at least two time-frequency tiles of at least one audio signal; and
encode each direction parameter value based on a codebook, wherein the codebook comprises two or more quantization resolutions arranged such that a first quantization resolution comprises a set of quantization values, and at least a second or succeeding quantization resolution comprises a further set of quantization values,
wherein the further set of quantization values incorporates the set of quantization values of the first quantization resolution, wherein to encode each direction parameter value based on the codebook, causes the apparatus to:
  determine, for each direction parameter value, a closest quantization value from the further set of quantization values of the second quantization resolution;
  generate, for each of the direction parameter values, a codeword index for the closest quantization value;
  determine a number of bits required to entropy encode the codeword indexes associated with the at least two time frequency tiles;
  compare the number of bits required to entropy encode the codeword indexes associated with the at least two time frequency tiles to an allocated number of bits, and when the number of bits required to entropy encode the codeword indexes is greater than the allocated number of bits, the apparatus is caused to:
  order the at least two time frequency tiles, based on a determined angular quantization distortion of the determined closest quantization values for the direction parameter values associated with the at least two time frequency tiles; and
iteratively in the order of the at least two ordered time frequency tiles and until the number of bits required to entropy encode the codeword indexes associated with the at least two time frequency tiles is equal to or less than the allocated number of bits, the apparatus is caused to: select a closest quantization value of a direction parameter value associated with an ordered time frequency tile; determine whether the selected closest quantization value is a member of the set of further quantization values but not a member of the set of quantization values of the first quantization resolution; and when the determination is affirmative regenerate a codeword index for the direction parameter value associated with the ordered time frequency tile using the set of quantization values of the first quantization resolution and determine the number of bits required to entropy encode the codeword indexes associated with the at least two time frequency tiles.

2. The apparatus as claimed in claim 1, wherein to encode the direction parameter values based on the codebook, further causes the apparatus to:
  encode azimuth direction parameter values based on the codebook; and encode elevation direction parameter values based on at least one average elevation direction parameter value for the at least two time frequency tiles.

3. The apparatus as claimed in claim 1, wherein the apparatus is further caused to determine the allocated number of bits for encoding the at least two time frequency tiles based on a value of an energy ratio value associated with the direction parameter values.

4. A method comprising:

obtaining a direction parameter value associated with each of at least two time-frequency tiles of at least one audio signal; and encoding each direction parameter value based on a codebook, wherein the codebook comprises two or more quantization resolutions arranged such that a first quantization resolution comprises a set of quantization values, and at least a second or succeeding quantization resolution comprises a further set of quantization values, wherein the further set of quantization values incorporates the set of quantization values of the first quantization resolution, wherein encoding the direction parameter values based on the codebook comprises:

determining, for each direction parameter value, a closest quantization value from the further set of quantization values of the second quantization resolution;

generating, for each of the direction parameter values, a codeword index for the closest quantization value;

determining a number of bits required to entropy encode the codeword indexes associated with the at least two time frequency tiles;

comparing the number of bits required to entropy encode the codeword indexes associated with the at least two time frequency tiles to an allocated number of bits, and when the number of bits required to entropy encode the codeword indexes is greater than the allocated number of bits, the method comprises:

ordering the at least two time frequency tiles, based on a determined angular quantization distortion of the determined closest quantization values for the direction parameter values associated with the at least two time frequency tiles; and iteratively in the order of the at least two ordered time frequency tiles and until the number of bits required to entropy encode the codeword indexes associated with the at least two time frequency tiles is equal to or less than the allocated number of bits, the method comprises: selecting a closest quantization value of a direction parameter value associated with an ordered time frequency tile; determining whether the selected closest quantization value is a member of the set of further quantization values but not a member of the set of quantization values of the first quantization resolution; and when the determination is affirmative regenerating a codeword index for the direction parameter value associated with the ordered time frequency tile using the set of quantization values of the first quantization resolution and determining the number of bits required to entropy encode the codeword indexes associated with the at least two time frequency tiles.

5. The method as claimed in claim 4, wherein encoding the direction parameter values based on the codebook further comprises:

encoding azimuth direction parameter values based on the codebook; and encoding elevation direction parameter values based on at least one average elevation direction parameter value for the at least two time frequency tiles.

6. The method as claimed in claim 4, further comprising determining the allocated number of bits for encoding the at least two time frequency tiles based on a value of an energy ratio value associated with the direction parameter values.

* * * * *